United States Patent
Han et al.

(10) Patent No.: US 7,968,275 B2
(45) Date of Patent: Jun. 28, 2011

(54) METHOD OF FORMING A PATTERN USING A PHOTORESIST COMPOSITION FOR IMMERSION LITHOGRAPHY

(75) Inventors: Seok Han, Gyeonggi-do (KR);
Young-Hoon Kim, Gyeonggi-do (KR);
Hyo-Sun Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 230 days.

(21) Appl. No.: 12/329,189

(22) Filed: Dec. 5, 2008

(65) Prior Publication Data
US 2009/0176177 A1     Jul. 9, 2009

(30) Foreign Application Priority Data

Dec. 7, 2007   (KR) ........................ 10-2007-0126620

(51) Int. Cl.
*G03F 7/20* (2006.01)
*G03F 7/30* (2006.01)
*G03F 7/38* (2006.01)
*G03F 7/039* (2006.01)

(52) U.S. Cl. ........ 430/326; 430/327; 430/330; 430/910; 430/270.1

(58) Field of Classification Search .................. None
See application file for complete search history.

(56) References Cited

U.S. PATENT DOCUMENTS

| 5,049,463 A | 9/1991 | Kato et al. |
| 2005/0147920 A1* | 7/2005 | Lin et al. ........................ 430/311 |

FOREIGN PATENT DOCUMENTS

| JP | 9-50126 | * | 2/1997 |
| KR | 1020000056474 A | | 9/2000 |
| KR | 1020010050240 | | 6/2001 |

OTHER PUBLICATIONS

DERWENT English abstract for JP 9-50126.*
Machine-assisted English translation of JP 9-50126 provided by JPO.*

* cited by examiner

*Primary Examiner* — Sin J. Lee
(74) *Attorney, Agent, or Firm* — Myers Bigel Sibley & Sajovec, PA

(57) ABSTRACT

A photoresist composition for immersion lithography and a method of forming a photoresist pattern using the photoresist composition are disclosed. The photoresist composition includes a photosensitive polymer including a cycloaliphatic group blocked with at least two cyclic acetal groups as a side chain, a photoacid generator and an organic solvent. The hydrophobic photoresist composition may be changed into the hydrophilic photoresist composition by an exposure process. Thus, before the exposure process, the photoresist composition may be insoluble in a liquid for the immersion lithography. After the exposure process, an exposure portion of a photoresist film formed using the photoresist composition may be effectively dissolved in a developing solution to form a uniform photoresist pattern.

4 Claims, 2 Drawing Sheets

METHOD OF FORMING A PATTERN USING A PHOTORESIST COMPOSITION FOR IMMERSION LITHOGRAPHY

BACKGROUND

1. Field

Example embodiments relate to photoresist compositions and methods of forming a photoresist pattern using the same. More particularly, example embodiments relate to photoresist compositions for immersion lithography and methods of forming a photoresist pattern using the same.

2. Description of the Related Art

As semiconductor devices having high operational speeds and large capacitances are in great demand, semiconductor manufacturing technology has been developed to improve the degrees of integration, reliability and/or response speeds of semiconductor devices. In order to decrease design rules so as to enhance the degrees of integration of the semiconductor devices, various methods of forming a fine pattern have been developed.

As wavelengths become shorter, the photoresist pattern may have a higher resolution and a smaller line width. For example, a photolithography process has been developed using a light source having a shorter wavelength than those of G-line rays having a wavelength of about 436 nm or I-line rays having a wavelength of about 365 nm used in a conventional photolithography process. The light source having the shorter wavelength than those of the G-line rays or the I-line rays may include a krypton fluoride (KrF) laser having a wavelength of about 248 nm, an argon fluoride (ArF) laser having a wavelength of about 193 nm, vacuum ultraviolet rays having a wavelength of about 157 nm or extreme ultraviolet rays having a wavelength of about 13 nm. The vacuum ultraviolet rays or the extreme ultraviolet rays may have a disadvantage of high cost. Thus, immersion lithography has been developed for obtaining a fine pattern.

Immersion lithography disposes a liquid for the immersion lithography between a lens and a photoresist film instead of air in a conventional photolithography process. Thus, when the krypton fluoride (KrF) laser having a wavelength of about 193 nm is used in immersion lithography, light having a shorter wavelength than about 193 nm is obtained. Such light and its shorter wavelength may improve the resolution of the photoresist pattern because a medium which has a higher refractive index than air is disposed between the immersion lithography lens and photoresist film.

In immersion lithography, the liquid for the immersion lithography directly contacts the photoresist film. Therefore, a hydrophilic material contained in the photoresist film may be soluble in the liquid. Thus the performance of the immersion lithography may deteriorate and the lens of an exposure device may be contaminated by any dissolved hydrophilic material contained in the photoresist film. However, when the hydrophobicity of the photoresist composition is improved for preventing the photoresist film from dissolving in the liquid for the immersion lithography, the photoresist film may be insoluble in a developing solution, or a hydrophobic material contained in the photoresist film may be aggregated to cause defects on the photoresist pattern.

In order to solve above-mentioned problem, it has been suggested to form a hydrophobic protective layer on the photoresist film. However, the wettability of the protective layer may deteriorate because a surface of the protective layer is hydrophobic and a uniform photoresist pattern may not be formed. Additionally, it may be undesirable to form the protective layer in view of time and costs.

Thus, there is still required a photoresist composition which is insoluble in the liquid for the immersion lithography without the protective layer before the exposure process and is soluble in the developing solution after the exposure process.

SUMMARY

Example embodiments provide a photoresist composition for immersion lithography. The hydrophilicity of the photoresist composition efficiently increases in an exposure process.

Example embodiments provide a method of forming a photoresist pattern without defects using a photoresist composition for the immersion lithography.

According to some example embodiments, there is provided a photoresist composition for immersion lithography including a photosensitive polymer, a photoacid generator and an organic solvent. The photosensitive polymer may include a plurality of cyclic acetal groups capable of generating a plurality of hydroxyl groups on exposure to an acid or a hydrogen ion so as to change the photoresist composition from hydrophobic to hydrophilic. The photosensitive polymer may include a cycloaliphatic group blocked with at least two cyclic acetal groups as a side chain.

In example embodiments, the photosensitive polymer may include a monomer represented by Formula 2, Formula 3 or Formula 4.

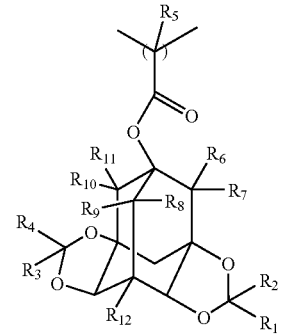

[Formula 2]

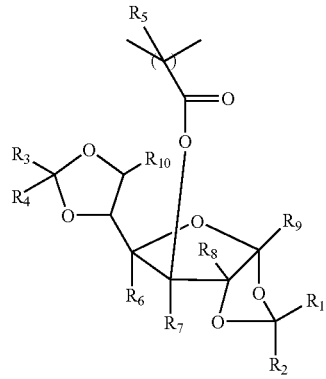

[Formula 3]

-continued

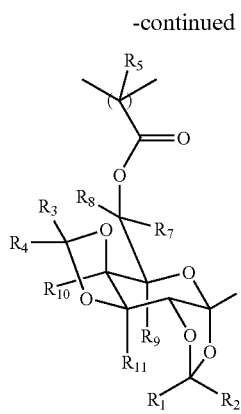

[Formula 4]

In Formulas 2 to 4, $R_1$ to $R_{12}$ independently may represent a hydrogen atom, a $C_1$-$C_{10}$ aliphatic group, a $C_3$-$C_{10}$ cycloaliphatic group or a $C_3$-$C_{10}$ aryl group.

According to some example embodiments, there is provided a method of forming a photoresist pattern. In the method, a photoresist composition for immersion lithography may be prepared. The photoresist composition may include a photosensitive polymer, a photoacid generator and an organic solvent. The photosensitive polymer may include a plurality of cyclic acetal groups capable of generating a plurality of hydroxyl groups on exposure to an acid or a hydrogen ion so as to change the photoresist composition from hydrophobic to hydrophilic. The photosensitive polymer may include a cycloaliphatic group blocked with at least two cyclic acetal groups as a side chain. The photoresist composition may be coated on an object to form a photoresist film on the object. After a liquid for the immersion lithography may be provided between the photoresist film and immersion lithography device, the photoresist film may be exposed to light. The photoresist film may be developed to form the photoresist pattern on the object.

Further, according to example embodiments, a photoresist composition may include a photosensitive polymer, the hydrophilicity of which may be improved by an exposure process. Before the exposure process, the photoresist composition may be hydrophobic so that a photoresist film formed using the photoresist composition may not be dissolved in a liquid for immersion lithography. However, the hydrophilicity of the photosensitive polymer may be improved after the exposure process to effectively be dissolved in a hydrophilic developing solution. Thus, the photoresist composition may not be aggregated during a developing process to form a photoresist pattern having a high resolution without defects.

DETAILED DESCRIPTION OF THE EMBODIMENTS

Figure 1:
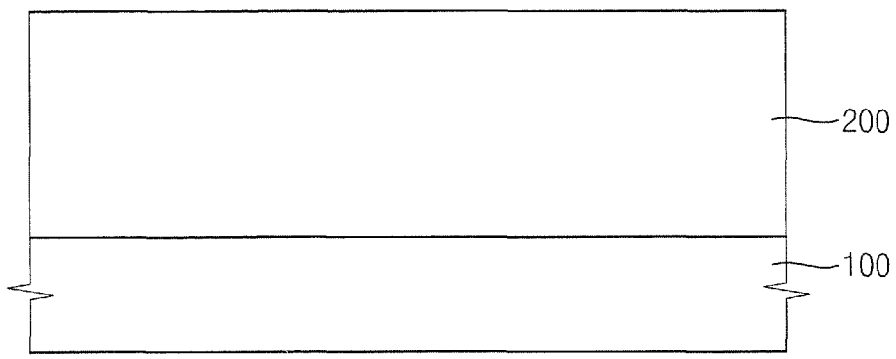
FIGS. 1 to 3 are cross-sectional views illustrating methods of forming a pattern in accordance with example embodiments.

This application claims the benefit of Korean Patent Application No. 10-2007-0126620, filed on Dec. 7, 2007, in the Korean Intellectual Property Office, the disclosure of which is incorporated herein in its entirety by reference.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Photoresist Composition for Immersion Lithography

According to some example embodiments, a photoresist composition for immersion lithography includes a photosensitive polymer, a photoacid generator and an organic solvent. The photosensitive polymer may be capable of generating a plurality of hydroxyl groups on exposure to an acid or a hydrogen ion so as to change the photoresist composition from hydrophobic to hydrophilic. The photosensitive polymer includes a cylcoaliphatic group as a side chain and the cylcoaliphatic group includes at least two cyclic acetal groups as a blocking group. The photosensitive polymer may have more than two cyclic acetal groups as the blocking group. When the cyclic acetal group is contacted with the acid, a ring of the cyclic acetal group is opened to produce two hydroxyl groups (OH) per one cyclic acetal group and thus the hydrophilicity of the photoresist composition rapidly may increases. Before the photoresist composition is exposed to light, the photosensitive polymer having the cycloaliphatic group with the cyclic acetal groups does not include a hydrophilic group, namely the photoresist composition is hydrophobic. Thus, a photoresist film formed using the photoresist composition is insoluble in a hydrophilic solution. After the photoresist composition is exposed to light, a plurality of hydroxyl groups is generated from the cyclic acetal group of the photosensitive polymer so that the hydrophilicity of the photoresist composition increases. Thus, the photoresist film formed using the photoresist composition may be soluble in the hydrophilic developing solution.

The cyclic acetal group may be represented by Formula 1.

[Formula 1]

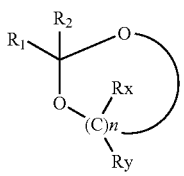

In Formula 1, $R_1$ and $R_2$ independently represent a hydrogen atom, a $C_1$-$C_{10}$ aliphatic group, a $C_3$-$C_{10}$ cycloaliphatic group or a $C_3$-$C_{10}$ aryl group, Rx and Ry independently represent a hydrogen atom, a $C_1$-$C_{10}$ aliphatic group or a $C_3$-$C_{10}$ cycloaliphatic group and n represents an integer in a range of about 1 to about 10.

In example embodiments, n may be an integer of 2 or 3 in the cyclic acetal group represented by Formula 1. When n is 2 or 3, the cyclic acetal group represented by Formula 1 may include a five-membered ring or a six-membered ring. For example, the cyclic acetal group represented by Formula 1 may be 1,3-dioxolane. As illustrated in Chemical Equation A, when 2-methyl-1,3-dioxolane is contacted with the acid, a ring cleavage is generated, thereby forming two hydroxyl group. When the photosensitive polymer according to example embodiments includes a 2-methyl-1,3-dioxolane as the blocking group, methyl-1,3-dioxolane having a low hydrophilicity may be converted into a glycol compound having a high hydrophilicity by contacting with the acid as illustrated in the following chemical equation. Thus, the hydrophilicity of the photosensitive polymer may increase.

Chemical Equation A

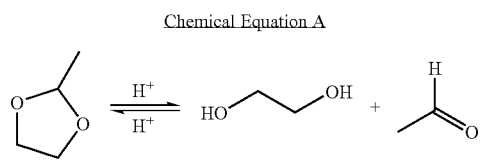

In some example embodiments, the photosensitive polymer having at least two cyclic acetal groups includes a monomer represented by Formula 2, Formula 3 or Formula 4.

[Formula 2]

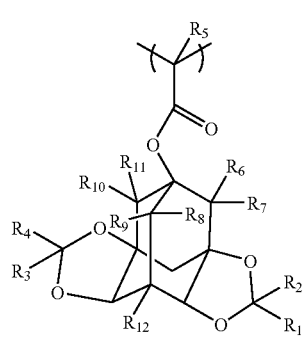

[Formula 3]

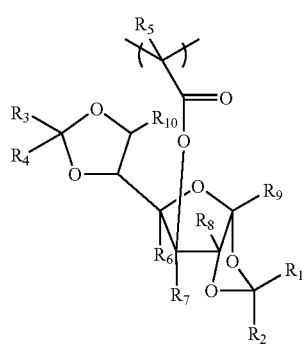

[Formula 4]

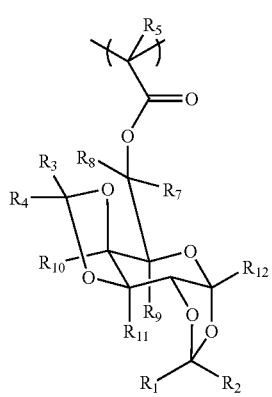

In Formulas 2 to 4, $R_1$ to $R_{12}$ independently represent a hydrogen atom, a $C_1$-$C_{10}$ aliphatic group, a $C_3$-$C_{10}$ cycloaliphatic group or a $C_3$-$C_{10}$ aryl group.

As illustrated in Formulas 2 to 4, the monomer of the photosensitive polymer may include at least two cyclic acetal groups. Thus, the monomer of the photosensitive polymer does not have a hydrophilic group. Before performing an exposure process, the photosensitive polymer may be hydrophobic and insoluble in a hydrophilic solution such as a liquid for the immersion lithography. After performing the exposure process, a bond cleavage in the cyclic acetal group of the photosensitive polymer is generated to form four hydroxyl groups per one monomer included in the photosensitive polymer. The hydrophilicity of the photosensitive polymer may rapidly increase and be improved due to the hydroxyl groups generated by the exposure process. Thus, an exposure portion of a photoresist film formed using the photoresist composition may be effectively soluble in a developing solution having a high hydrophilicity, thereby forming a photoresist pattern having a high resolution.

In example embodiments, the photosensitive polymer may further include a monomer represented by Formula 5, Formula 6, Formula 7 or Formula 8.

[Formula 5]

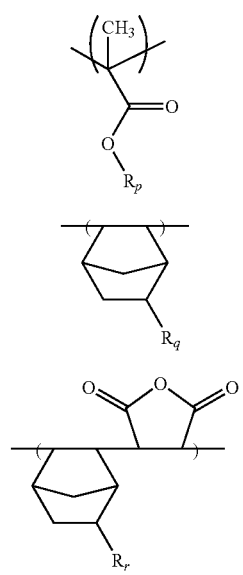

[Formula 6]

[Formula 7]

[Formula 8]

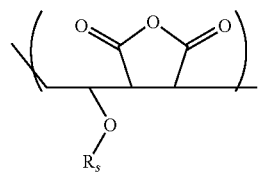

In Formulas 5 to 8. $R_p$, $R_q$, $R_r$ and $R_s$ independently represent a hydrogen atom, a $C_1$-$C_{10}$ aliphatic group, a $C_3$-$C_{10}$ cycloaliphatic group, a $C_3$-$C_{10}$ aryl group, an adamantyl group, a lactone group, an isobornyl group, a tetrahydropyranyl group, a tetrahydrofuranyl group, an 1-ethoxyethyl group, an acetal group, etc.

The photosensitive polymer may include at least one monomer represented by Formula 2, Formula 3 or Formula 4 and further include the monomer represented by Formula 5, Formula 6, Formula 7 or Formula 8. The monomer represented by Formulas 5 to 8 may increase the hydrophobicity of the photosensitive polymer before performing the exposure process. The monomer represented by Formulas 5 to 8 may include an acid-liable group, thereby additionally increasing the hydrophilicity of the photosensitive polymer after performing the exposure process.

In example embodiments, the photosensitive polymer may be represented by Formula 9, Formula 10 or Formula 11.

[Formula 9]

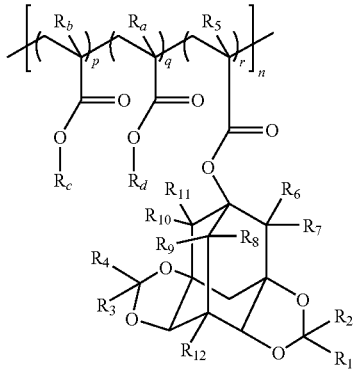

[Formula 10]

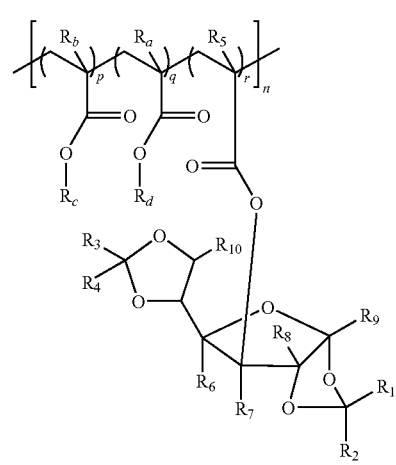

[Formula 11]

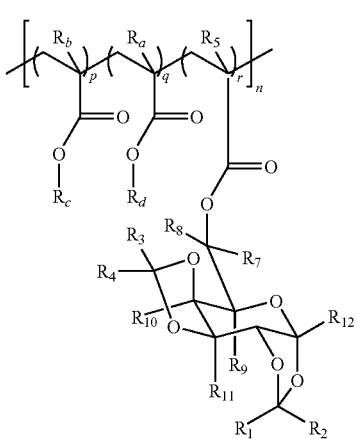

In formulas 9 to 11, wherein $R_1$ to $R_{12}$, $R_a$ and $R_b$ independently represent a hydrogen atom, a $C_1$-$C_{10}$ aliphatic group, a $C_3$-$C_{10}$ cycloaliphatic group or a $C_3$-$C_{10}$ aryl group. $R_c$ and $R_d$ independently represent a hydrogen atom, a $C_1$-$C_{10}$ aliphatic group, a $C_3$-$C_{10}$ cycloaliphatic group, a $C_3$-$C_{10}$ aryl group, an adamantyl group, a lactone group, an isobornyl group, a tetrahydropyranyl group, a tetrahydrofuranyl group, an 1-ethoxyethyl group or an acetal group, p and q are in a range of about 0 to about 0.6 and r is in a range of about 0.4 to about 1, p, q and r satisfy an equation p+q+r=1, and n represents an integer in a range of about 100 to about 10,000.

The photosensitive polymer represented by Formulas 9 to 11 may be hydrophobic because the photosensitive polymer does not include a hydrophilic group. The photoresist film formed using the photoresist composition including the photosensitive polymer may be insoluble in the liquid for the immersion lithography to reduce influence of the liquid for the immersion lithography on the photoresist film.

As illustrated in Chemical Equation B, the ring cleavage of the cyclic acetal group in the photosensitive polymer is generated by providing an acid and an energy to form at least four hydroxyl groups per one repeat unit included in the photosensitive polymer. Hence, after the exposure process, the hydrophilicity of the photosensitive polymer may be rapidly improved.

When the photosensitive polymer includes a hydrophilic group prior to the exposure process or the photosensitive polymer includes less than two hydrophilic groups per one repeat unit after exposure process, a solubility of the photosensitive polymer to the hydrophilic solution may not be sufficiently improved by the exposure process. According to example embodiments, the photosensitive polymer included in the photoresist composition may form four hydroxyl groups per one repeat unit after the exposure process so that the solubility of the photoresist composition in the hydrophilic solution may be increased by about four times. Thus, the photoresist composition according to the example embodiments may be insoluble in the liquid for the immersion lithography solution prior to the exposure process and the photoresist composition according to the example embodiments may be effectively soluble in the hydrophilic developing solution after the exposure process. Thus, the photoresist film exposed to light in the exposure process may have a high hydrophilicity and the photoresist film unexposed to light in the exposure process may have a hydrophobicity and thus the photoresist pattern having a high resolution may be formed. Additionally, aggregates may not be generated in the exposed photoresist film and thus the photoresist pattern having a good profile without defects may be formed.

When r in the photosensitive polymer represented by Formula 9 to 11 is less than 0.4, a ratio of the monomer generating a plurality of the hydroxyl groups is low that the hydrophilicity of the photoresist composition may not be sufficiently improved after the exposure process. In one example embodiment, r may be more than about 0.4. In another example embodiment, r may be in a range of about 0.5 to about 0.8.

According to example embodiments, the photoresist composition may include about 5 percent by weight to about 15 percent by weight of the photosensitive polymer based on the total weight of the photoresist composition. When the photoresist composition includes less than about 5 percent by weight of the photosensitive polymer, the solubility of the photoresist composition to the hydrophilic solution such as the developing solution may not be increased by the exposure process. When the photoresist composition includes more than about 15 percent by weight of the photoresist polymer, the viscosity of the photoresist composition may be too high and thus the photoresist composition may not form the photoresist film having a uniform thickness. In one example embodiment, the photoresist composition may include about 5 percent by weight to about 15 percent by weight of the photosensitive polymer. In another example embodiment, the photoresist composition may include about 8 percent by weight to about 12 percent by weight of the photosensitive polymer.

Chemical Equation B

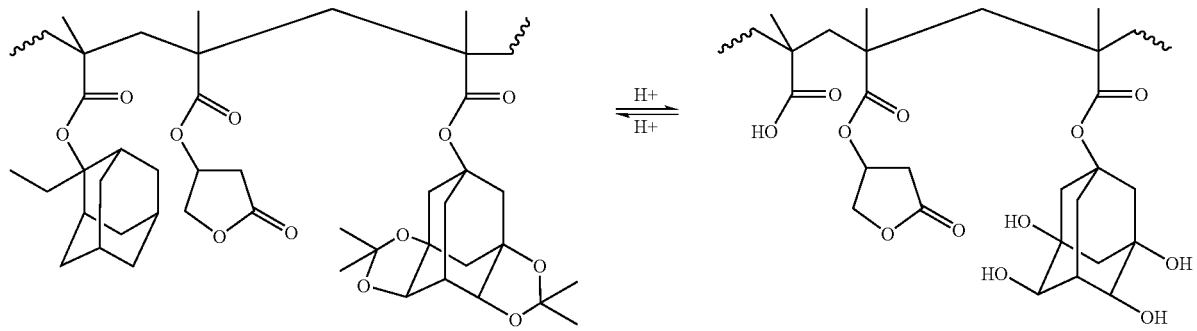

The photoresist composition may include about 0.25 percent by weight to about 9 percent by weight of a photoacid generator. The photoacid generator may react to light thereby generating an acid or a hydrogen ion. The acid generated from the photoacid generator may detach an acid-liable group from the photosensitive polymer to change the solubility of the photosensitive polymer to the developing solution.

When the photoresist composition includes less than about 0.25 percent by weight of the photoacid generator, the amount of the acid or the hydrogen ion generated by the photoacid generator may be insufficient so that an ability to separate the acid-liable group from the photosensitive polymer may be reduced. When the photoresist composition includes more than about 9 percent by weight of the photoacid generator, the amount of the acid or the hydrogen ion generated by the photoacid generator may be excessive so that edge portions of the photoresist pattern may have a round shape or the photoresist film may be damaged during the developing process. Thus, in one example embodiment, the photoresist composition may include about 0.25 percent by weight to about to about 9 percent by weight of the photoacid generator. In another example embodiment, the photoresist composition may include about 1 percent by weight to about 6 percent by weight of the photoacid generator.

In example embodiments, the photoacid generator may include a sulfonium salt, a triarylsulfonium salt, a diarylsulfonium salt, a monoarylsulfonium salt, an iodonium salt, a diaryliodonium salt, a nitrobenzyl ester, a disulfone, a diazodisulfone, a sulfonate, trichloromethlyl triazine, N-hydroxysuccinimide triflate, etc. For example, the photoacid generator may include triphenylsulfonium triflate, monophenylsulfonium triflate, monophenylsulfonium nonaflate, triphenylsulfonium antimony salt, diphenyliodonium triflate, diphenyliodonium antimony salt, methoxydiphenyliodonium triflate, di-t-butyldiphenyliodonium triflate, 2,6-dinitrobenzyl sulfonate, pyrogallol tris(alkylsulfonate), norbornene-dicarboxylmide triflate, triphenylsulfonium nonaflate, diphenyliodonium nonaflate, methoxydiphenyliodonium nonaflate, di-t-butyldiphenyliodonium nonafilate, N-hydroxysuccinimide nonaflate, norbornene dicarboxylmide nonaflate, triphenylsulfonium perfluorooctanesulfonate, diphenyliodonium perfluorooctanesulfonate, methoxyphenyliodonium perfluorooctanesulfonate, di-t-butyldiphenyliodonium perfluorooctanesulfonate, N-hydroxysuccinimide perfluorooctanesulfonate, norbornene-dicarboxylmide perfluorooctanesulfonate, etc. These may be used alone or in combination.

The photoresist composition may include an organic solvent. In example embodiments, the organic solvent may include ethylene glycol monomethyl ether, ethylene glycol monoethyl ether, propylene glycol methyl ether, methyl cellosolve acetate, tetrahydrofuran, ethyl cellosolve acetate, diethylene glycol monomethyl ether, diethylene glycol monoethyl ether, propylene glycol methyl ether acetate, propylene glycol propyl ether acetate, diethylene glycol dimethyl ether, ethyl lactate, toluene, xylene, methyl isobutyl ketone, methyl ethyl ketone, cyclopentanone, 2-pentanone, 3-pentanone, cyclohexanone, 2-heptanone, 3-heptanone, 4-heptanone, ethyl acetate, butyl acetate, etc. These may be used alone or in combination thereof.

The photoresist composition may further include an organic base. The organic base may adjust a diffusion distance of the acid or the hydrogen ion generated by the photoacid generator. This permits formation of the photoresist pattern having a desired shape and allow reduction of line width roughness of the photoresist pattern.

The photoresist composition may include about 0.01 percent by weight to about 5 percent by weight of the organic base. When the photoresist composition includes less than about 0.01 percent by weight of the organic base, the organic base may not sufficiently affect the shape and the line width roughness of the photoresist pattern. When the photoresist composition includes more than about 5 percent by weight of the organic base, the line width roughness of the photoresist pattern may not be further decreased to be economically disadvantageous. Thus, in one example embodiment, the photoresist composition may include about 0.01 percent by weight to about 5 percent by weight of the organic base and, in another example embodiment, the photoresist composition may include about 0.1 percent by weight to about 3 percent by weight of the organic base.

In some example embodiments, the organic base used for the photoresist composition may include triethylamine, triisobutyl amine, triisooctyl amine, triisodecylamine, diethanolamine, triethanolamine, etc. These may be used alone or in combination.

The photoresist composition may further include additives such as a surfactant, a sensitizer, an adhesive or a preservation stabilizer. Examples of the surfactant may include an ether compound such as polyoxyethylene lauryl ether, polyoxyethylene stearyl ether, polyoxyethylene oleyl ether, polyoxyethylene nonylphenyl ether, etc. The sensitizer, the adhesive and the preservation stabilizer may include an amine-based compound.

A photoresist composition according to example embodiments may include a photosensitive polymer which is changed from a hydrophobic polymer into a hydrophilic polymer by an acid or a hydrogen ion. The photosensitive polymer may enable a photoresist film to have hydrophobicity before the exposure process. Therefore, the photoresist film may not be dissolved in a liquid for immersion lithography. The hydrophilicity of the photosensitive polymer may be considerably improved after the exposure process to effectively dissolve an exposure portion of the photoresist film and prevent an aggregation of the photosensitive polymer during a developing process. Thus, the photoresist film may be uniformly developed without defects to form a photoresist pattern having a high resolution.

A method of forming a photoresist pattern using the above-mentioned photoresist composition according example embodiments will be described in more detail, hereinafter, with reference to the accompanying drawings.

Method of Forming Photoresist Pattern

Figure 2:
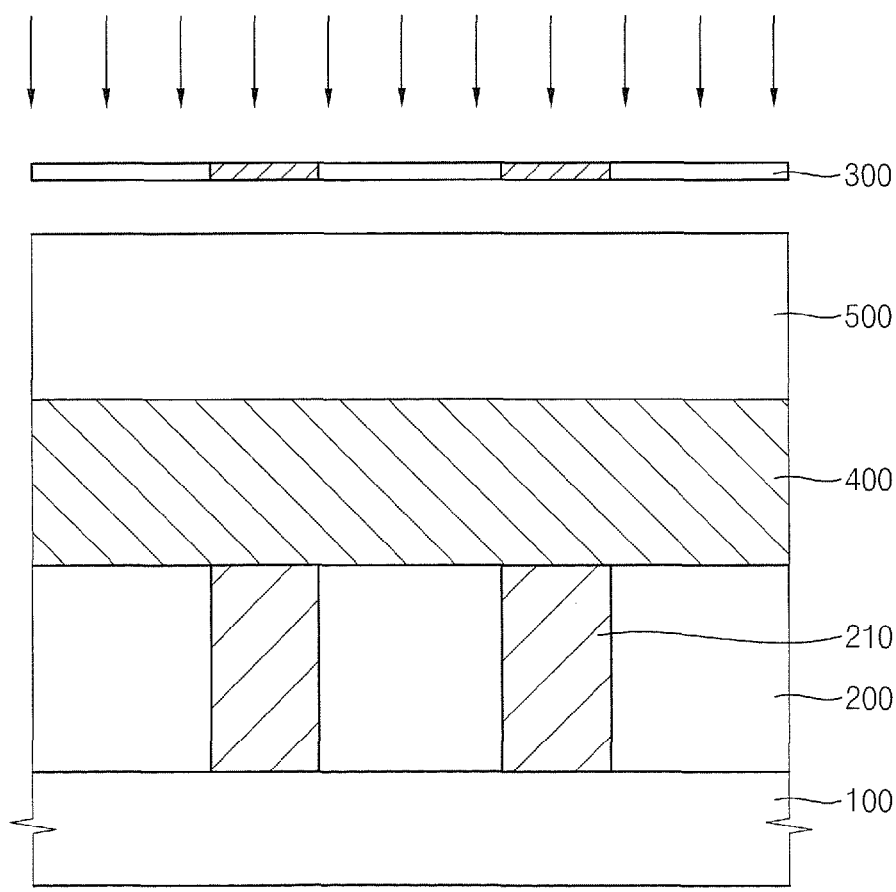
Figure 3:
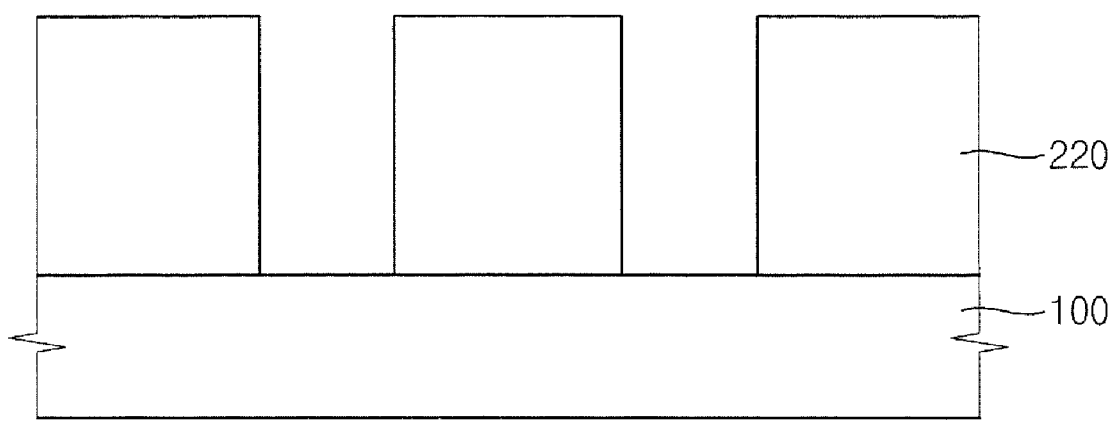

FIGS. 1 to 3 are cross-sectional views illustrating a method of forming a photoresist pattern using a photoresist composition in accordance with example embodiments.

Referring to FIG. 1, an object that is etched may be prepared. The object may be a substrate such as a silicon wafer or a substrate on which a film or a structure is formed. In some example embodiments, the object may be a substrate on which a silicon nitride layer or a silicon oxide layer is formed. The substrate may include a semiconductor substrate such as silicon substrate, a germanium substrate, a silicon-germanium substrate, etc. Alternatively, the substrate may include a silicon-on-insulator (SOI) substrate or a germanium-on-insulator (GOI) substrate. Hereinafter, it will be described that the object may be the silicon substrate 100.

In some example embodiments, after preparing the silicon substrate 100, the silicon substrate may be cleaned to remove moisture or contaminants from the silicon substrate 100.

In some example embodiments, an anti-reflection layer (not illustrated) may be formed on the silicon substrate 100. The anti-reflection layer may include an organic anti-reflection layer or an inorganic anti-reflection layer.

A photoresist film 200 is formed using a photoresist composition including a photosensitive polymer, a photoacid generator and an organic solvent on the substrate 100. The photosensitive polymer includes a cycloaliphatic group blocked with at least two cyclic acetal groups as a side chain.

The photosensitive polymer may include a cylcoaliphatic group as a side chain and the cylcoaliphatic group include at least two cyclic acetal groups as a blocking group. The photosensitive polymer may have more than two cyclic acetal groups per one repeat unit. In some example embodiments, the photosensitive polymer may include at least one monomer represented by Formula 2, Formula 3 or Formula 4.

[Formula 2]

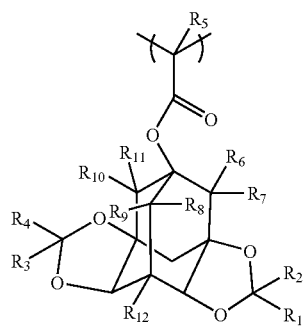

[Formula 3]

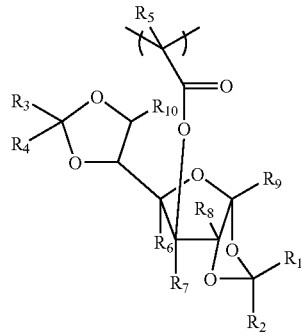

[Formula 4]

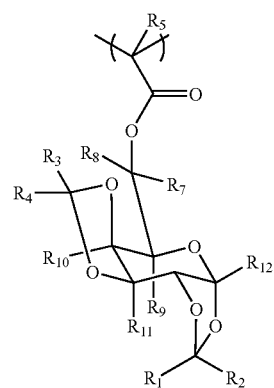

In Formulas 2 to 4, $R_1$ to $R_{12}$ independently represent a hydrogen atom, a $C_1$-$C_{10}$ aliphatic group, a $C_3$-$C_{10}$ cycloaliphatic group or a $C_3$-$C_{10}$ aryl group.

The photosensitive polymer may include the cylcoaliphatic group blocked with at least two cyclic acetal groups as the side chain. Thus, before performing an exposure process, the photoresist film 200 formed using the photoresist composition may be insoluble in a hydrophilic solution. After performing the exposure process, a plurality of the hydroxyl group is generated from the cyclic acetal group of the photosensitive polymer so that a hydrophilicity of the photoresist composition may increase and the photoresist film 200 exposed to light may be effectively dissolved in a hydrophilic developing solution. The photosensitive polymer according to example embodiments has been previously fully described, so any further explanations in this regard will be omitted herein for brevity.

The photoresist film 200 may have a thickness of about 700 Å to about 10,000 Å. The thickness of the photoresist film 200 may not be limited to the above thickness.

A first baking process may be performed. The substrate 100 on which the photoresist film 200 is formed is heated in the first baking process. The first baking process may be performed at a temperature of about 50° C. to about 300° C. An organic solvent included in the photoresist film 200 may be volatile during the first baking process to enhance adhesive strength between the photoresist film 200 and the substrate 100.

After performing the first baking process, the substrate 100 may be exposed to light using an exposure device. A liquid for the immersion lithography 400 may be positioned between the exposure device and the photoresist film 200 instead of air. The liquid for the immersion lithography 400 may have a relatively higher refractive index than the air to reduce a wavelength of light while the light pass the liquid for the immersion lithography 400. Hence, a pattern having a high resolution may be formed on the substrate 100. In some example embodiments, the photoresist film 200 may be sufficiently hydrophobic to be insoluble in the liquid for the immersion lithography 400 which directly contacts the photoresist film 200 and to prevent the photoresist film 200 from being damaged during the exposure process.

After a mask 300 having a predetermined pattern is positioned on a mask stage in the exposure device, the mask 300 may be arranged on the substrate 100 on which the photoresist film 200 is formed. Light may be irradiated onto the photoresist Film 200 through the mask 300 for a predetermined time to selectively expose the photoresist film 200 to light.

In some example embodiments, the liquid for the immersion lithography 400 may have a substantially higher refractive index than the air. For example, the liquid for the immersion lithography 400 may include a solution including a fluorine-based compound such as perfluoroether or perfluoro alkyl amine, water ($H_2O$), heavy water ($D_2O$), xylene, etc.

In some example embodiments, light used in the exposure process may have a wavelength of about 10 nm to about 500 nm. For example, the light may include a mercury-xenon (Hg—Xe) lamp, G-line rays, I-line rays, a krypton fluoride laser, an argon fluoride laser, an electron beam, X-rays, soft X-rays, extreme ultraviolet rays, vacuum ultraviolet rays, etc.

After performing the exposure process, a second baking process may be performed at the photoresist film 200. The second baking process may be performed at a temperature of about 50° C. to 300° C. When the exposure process and the second baking process are performed, properties of the exposure portion 210 of the photoresist film 200 may be changed from hydrophobicity into hydrophilicity. In some example embodiments, when the photoresist film 200 is exposed to light, an acid or a hydrogen ion (H+) may be generated at the exposure portion 210 of the photoresist film 200. A plurality of hydroxyl groups (OH) may be produced from the photosensitive polymer by the acid or the hydrogen ion ($H^+$) to change properties of the exposure portion 210 of the photoresist film 200.

Referring to FIG. 3, a developing process may be performed using a developing solution to remove the exposure portion 210 of the photoresist film 200 and to form the photoresist pattern 220. The developing solution used for the developing process may have basic properties. In some example embodiments, the developing solution used or the developing process may be an aqueous solution including sodium hydroxide, potassium hydroxide, sodium carbonate, sodium silicate, sodium metasilicate, ammonia, ethylamine, n-propyl amine, diethylamine, di-n-propyl amine, triethylamine, methyl ethylamine, dimethylethanolamine, triethanolamine, tetramethylammonium hydroxide (TMAH), tetraethylammonium hydroxide (TEAH), pyrrole, piperidine, coline, etc. For example, the developing solution may be the aqueous solution including tetramethylammonium hydroxide.

Successive processes including a cleaning process may be preformed on the photoresist pattern 220 formed on the substrate 100. The substrate 100 may be etched using the photoresist pattern 220 as an etching mask to form various structures in a semiconductor device.

Hereinafter, example embodiments will be described in more detail with reference to a Synthesis Example for the photosensitive polymer and an Example and a Comparative Example for the photoresist composition.

Synthesis of a Monomer for a Photosensitive Polymer

Synthesis Example 1

Synthesis of 3,4:6,7-dioxolane-adamantyl Methacrylate

After about 300 mL of acetone and about 20 mL of pentane were mixed in a two-neck flask, about 100 g of 1,3,4,6,7-pentahydroxy adamantane and about 3.09 g of p-toluene sulfonic acid were added into the two-neck flask to prepare a solution. The solution was refluxed using a Dean-Stark trap on which a stirrer and a condenser were set up at a constant temperature until water was not produced. When water was not produced, the temperature of the solution was lowered to a room temperature. About 0.3 g of magnesium sulfate (MgSO$_4$) was added into the resulting solution and was stirred for about 30 minutes. After magnesium sulfate was removed from the solution by filtration, a filtrate was distilled under reduced pressure to obtain 3,4:6,7-dioxolane-adamantanol.

About 21.2 g of 3,4:6,7-dioxolane-adamantanol and about 16.3 g of triethylamine were dissolved in about 400 mL of benzene to prepare a solution. The temperature of the solution was lowered to about 0° C. and methyl chloride (CH$_3$Cl) was slowly added into the solution. After about 24 hours, a salt of triethylamine was removed from the solution by filtration to prepare a first filtrate. About 0.3 g of magnesium sulfate was added into the first filtrate to remove water from the first filtrate. Magnesium sulfate was removed by filtration from the first filtrate to prepare a second filtrate. After methylene blue of a polymerization inhibitor was added into the second filtrate, the second filtrate was distilled under reduced pressure under methylene blue to obtain about 12 g of 3,4:6,7-dioxolane-adamantyl methacrylate represented by Formula 12.

Synthesis Example 2

Synthesis of 1,2:5,6-di-O-isopropylidene-3-O-methacryloyl-glucofuranose

After about 400 mL of anhydrous acetone was inserted into a two-neck flask, about 75 g of glucose, about 60 g of zinc chloride and about 4 g of anhydrous phosphoric acid were added into anhydrous acetone. Glucose, zinc chloride and anhydrous phosphoric acid were dissolved in anhydrous acetone by string the resulting mixture for about 30 minutes at a room temperature to prepare a first solution. When the color of the first solution became dark yellow, undissolved glucose was removed from the first solution by filtration to prepare a first filtrate. After the temperature of the first filtrate was lowered to about 0° C., a mixture, which was prepared by mixing about 40 mL of water and about 40 mL of sodium hydroxide, was added into the first filtrate to prepare a second solution having a pH of about 10 to about 11. After the second solution was filtered to prepare a second filtrate, a second filtrate was distilled under reduced pressure to obtain a solid material. Water and chloroform were added into the solid material and then an extraction was performed three times. Extracted chloroform was distilled under reduced pressure to obtain a white solid material. After the white solid material was dissolved in a mixture including about 30 mL of chloroform and about 20 mL of hexane, a recrystallization was performed to prepare 1,2:5,6-di-O-isopropylidene-glucofuranose.

A mixture prepared by mixing about 12 mL of pyridine and about 18 mL of about chloroform was inserted into a two neck flask. About 15.6 g of 1,2:5,6-di-O-isopropylidene-glucofuranose obtained by the above-mentioned method was dissolved in the mixture to prepare a third solution. After about 6.27 g of methylene chloride was slowly dropped into the third solution, the third solution including methylene chloride was refluxed under a nitrogen atmosphere for about 24 hours to obtain a fourth solution. Aqueous hydrogen chloride prepared by mixing water and concentrated HCl (37% by weight of aqueous hydrogen chloride) with ratio of about 3:1 was added into the fourth solution and then the fourth solution was stirred for about 1 hour. After adding chloroform the fourth solution, an extraction was performed to obtain an organic phase including chloroform. The organic phase including chloroform was distilled under reduced pressure to prepare a colorless liquid. After the colorless liquid was dissolved in n-hexane, about 0.5 N of aqueous sodium hydroxide was added several times to prepare a fifth solution. An organic phase was separated from the fifth solution. After the organic phase was dried for about 24 hours by adding anhydrous calcium chloride to evaporate a solvent, methylene blue of a polymerization inhibitor was added and then was distilled under reduced pressure to obtain 1,2:5,6-di-O-isopropylidene-3-O-methacryloyl-glucofuranose represented by Formula 13.

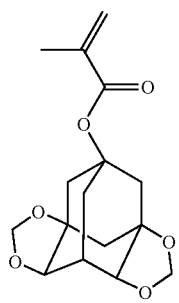

[Formula 12]

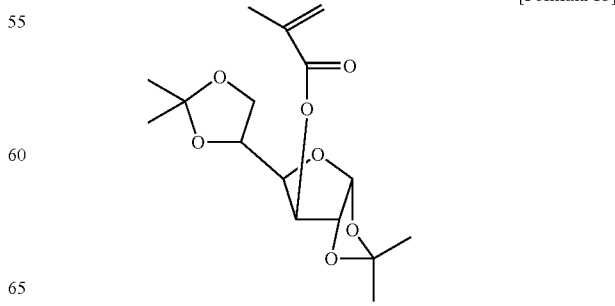

[Formula 13]

Synthesis Example 3

Synthesis of 1,2:3,4-di-O-isopropylidene-6-O-methacryloyl-galactopyranose 1,2:3,4-di-O-isopropylidene-6-O-methacryloyl-galactopyranose represented by Formula 14 was obtained by performing substantially the same processes as those of Synthesis Example 2 except for using galactose instead of glucose.

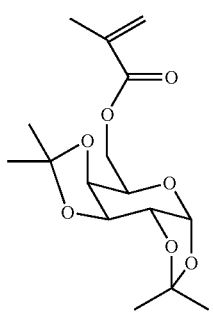

[Formula 14]

Synthesis of Photoresist Compositions

Example 1

About 20 mol percent of ethyl adamantyl methacrylate, about 20 mol percent of tetrahydro-2-oxo-4-furanyl methacrylate and about 60 mol percent of 3,4:6,7-dioxolane-adamantyl methacrylate synthesized in Synthesis Example 1 were polymerized to prepare a photosensitive polymer. After about 9 percent by weight of the photosensitive polymer, about 1.85 percent by weight of triphenylsulfonium triflate was dissolved in about 89 percent by weight of propylene glycol monomethyl ether acetate, about 0.15 percent by weight of triisootylamine was added and dissolved in propylene glycol monomethyl ether acetate. Then the resulting solution was filtered using a membrane filter of about 0.2 μm to prepare a photoresist composition.

Example 2

A photoresist composition was prepared by performing substantially the same process as that of Example 1 except for using 1,2:5,6-di-O-isopropylidene-3-O-methacryloyl-glucofuranose synthesized in Synthesis Example 2 instead of 3,4:6,7-dioxolane-adamantyl methacrylate synthesized in Synthesis Example 1.

Example 3

A photoresist composition was prepared by performing substantially the same process as that of Example 1 except for using 1,2:3,4-di-O-isopropylidene-6-O-methacryloyl-galactopyranose synthesized in Synthesis Example 3 instead of 3,4:6,7-dioxolane-adamantyl methacrylate synthesized in Synthesis Example 1.

Comparative Example

A photoresist composition was prepared by performing substantially the same process as that of Example 1 except for using (3-hydroxy adamantyl)-methacrylate instead of 3,4:6,7-dioxolane-adamantyl methacrylate synthesized in Synthesis Example 1.

Evaluation of a Solubility of Photoresist Compositions

Experiment 1

4-inch wafers were coated with photoresist compositions prepared in Example 1, Example 2, Example 3 and the Comparative Example, respectively, to form the photoresist films having a thickness of about 3,000 Å on each of the 4-inch wafers. After a baking process was performed at a temperature of about 150° C. the wafers on which the photoresist film was formed were immersed in water for about 60 seconds. The wafers were taken out of water and then each thickness of the photoresist films formed on the wafers was measured. The result is illustrated in Table 1.

Experiment 2

4-inch wafers were coated with photoresist compositions prepared in Example 1, Example 2, Example 3 and the Comparative Example, respectively, to form the photoresist films having a thickness of about 3,000 Å on each of the 4-inch wafers. Each of the photoresist films was exposed to ArF light. After a baking process was performed at a temperature of about 150° C., the wafers on which the photoresist film was formed were immersed in an aqueous tetramethylammonium solution for about 60 seconds. The wafers were taken out of the aqueous tetramethylammonium solution and then each thickness of the photoresist films formed on the wafers was measured. The result is illustrated in Table 1.

TABLE 1

| | Example 1 | Example 2 | Example 3 | Comparative Example |
|---|---|---|---|---|
| Experiment 1 | 2,974 Å | 2,985 Å | 2,970 Å | 2,900 Å |
| Experiment 2 | — | — | — | Photoresist film partially remains |

When the photoresist films were immersed in the water, the thickness reduction amounts of the photoresist films formed using Example 1, Example 2 and Example 3 were less, compared to the thickness reduction of the photoresist film formed using the Comparative Example. When the photoresist films were immersed in the aqueous tetramethylammonium solution after exposing to ArF light, the photoresist films formed using Example 1, Example 2 and Example 3 did not remain on the wafers. However, the photoresist film formed using the Comparative Example partially remained on the wafer.

As illustrated in Experiment 1 and Experiment 2, before the exposure process, the photoresist film formed using the photoresist composition according to example embodiments may not be affected by the liquid for the immersion lithography due to the high hydrophobicity of the photoresist composition. However, after the exposure process, the photoresist film formed using the photoresist composition according to example embodiments may be effectively dissolved in the hydrophilic developing solution due to the high hydrophilicity of the photoresist composition.

According to example embodiments, when a photoresist composition including a photosensitive polymer is exposed to light, a plurality of hydrophilic functional groups may be generated to improve the hydrophilicity of the photoresist composition. Thus, a photoresist film formed using the photoresist composition may not be affected by a liquid for immersion lithography before an exposure process. However, the photoresist film formed using the photoresist composition may be effectively dissolved in the developing solution after the exposure process. When a photoresist pattern is formed using the photoresist composition, aggregates of the photoresist composition may be prevented to form a uniform photoresist pattern having a good profile. Hence, damage to the semiconductor device may be prevented and thus the yield for manufacturing a semiconductor device may be enhanced.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of forming a photoresist pattern comprising:
preparing a photoresist composition for immersion lithography including a photosensitive polymer having a cycloaliphatic group blocked with at least two cyclic acetal groups as a side chain, a photoacid generator and an organic solvent; wherein the photosensitive polymer includes a monomer represented by Formula 2,

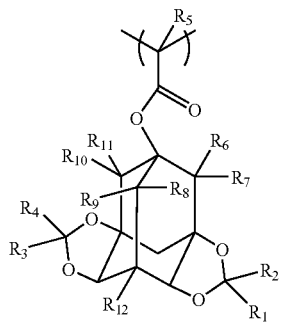

[Formula 2]

wherein $R_1$ to $R_{12}$ independently represent a hydrogen atom, a $C_1$-$C_{10}$ aliphatic group, a $C_3$-$C_{10}$ cycloaliphatic group or a $C_3$-$C_{10}$ aryl group; or wherein the photosensitive polymer includes a monomer represented by Formula 4,

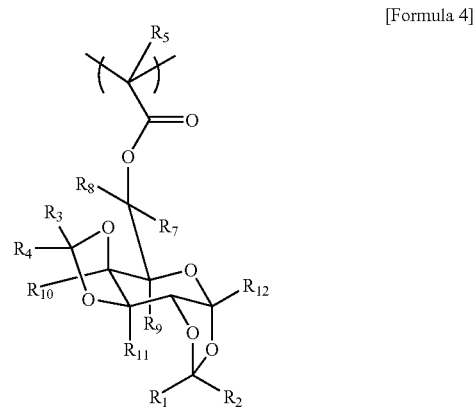

[Formula 4]

wherein $R_1$ to $R_{12}$ independently represent a hydrogen atom, a $C_1$-$C_{10}$ aliphatic group, a $C_3$-$C_{10}$ cycloaliphatic group or a $C_3$-$C_{10}$ aryl group;

forming a photoresist film on an object using the photoresist composition;

providing a liquid for the immersion lithography between the photoresist film and immersion lithography device;

exposing the photoresist film using the immersion lithography device; and developing the photoresist film.

2. The method of claim 1, after forming the photoresist film, further comprising:
first baking the photoresist film at a temperature of about 50° C. to about 300° C.

3. The method of claim 1, the liquid for the immersion lithography includes one selected from the group consisting of a solution including a fluorine-based compound, water and xylene.

4. The method of claim 1, after exposing the photoresist film, further comprising,
second baking the photoresist film at a temperature of about 50° C. to about 300° C.

* * * * *